(12) United States Patent
Qian et al.

(10) Patent No.: US 10,026,682 B2
(45) Date of Patent: Jul. 17, 2018

(54) GROUND VIA CLUSTERING FOR CROSSTALK MITIGATION

(71) Applicant: Intel Corporation, Santa Clara, CA (US)

(72) Inventors: Zhiguo Qian, Chandler, AZ (US); Kemal Aygun, Chandler, AZ (US); Yu Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/369,659

(22) Filed: Dec. 5, 2016

(65) Prior Publication Data

US 2017/0148714 A1    May 25, 2017

Related U.S. Application Data

(63) Continuation of application No. 14/943,880, filed on Nov. 17, 2015, now Pat. No. 9,515,017, which is a continuation of application No. 14/575,956, filed on Dec. 18, 2014, now Pat. No. 9,230,900.

(51) Int. Cl.
*H01L 23/498* (2006.01)
*H01L 21/48* (2006.01)

(52) U.S. Cl.
CPC ...... *H01L 23/49827* (2013.01); *H01L 21/486* (2013.01); *H01L 23/49816* (2013.01); *H01L 23/49838* (2013.01); *H01L 2924/0002* (2013.01)

(58) Field of Classification Search
CPC .................................................. H01L 2924/00
See application file for complete search history.

(56) References Cited

U.S. PATENT DOCUMENTS

| 5,629,838 A * | 5/1997 | Knight ............... G01R 31/3025 257/E23.01 |
| 5,841,191 A | 11/1998 | Chia et al. |
| 6,563,340 B1 * | 5/2003 | Jones ...................... H01L 25/18 326/101 |

(Continued)

FOREIGN PATENT DOCUMENTS

| JP | H10326851 A | 12/1998 |
| KR | 1020130094523 A | 8/2013 |

OTHER PUBLICATIONS

Notice of Allowance dated Aug. 28, 2015 for U.S. Appl. No. 14/575,956, 8 pages.

(Continued)

*Primary Examiner* — Thao P Le
(74) *Attorney, Agent, or Firm* — Schwabe, Williamson & Wyatt, P.C.

(57) ABSTRACT

Embodiments of the present disclosure are directed towards techniques and configurations for ground via clustering for crosstalk mitigation in integrated circuit (IC) assemblies. In some embodiments, an IC package assembly may include a first package substrate configured to route input/output (I/O) signals and ground between a die and a second package substrate. The first package substrate may include a plurality of contacts disposed on one side of the first package substrate and at least two ground vias of a same layer of vias, and the at least two ground vias may form a cluster of ground vias electrically coupled with an individual contact. Other embodiments may be described and/or claimed.

20 Claims, 5 Drawing Sheets

(56) References Cited

U.S. PATENT DOCUMENTS

| | | | |
|---|---|---|---|
| 6,743,661 B1 | 6/2004 | Drewery | |
| 8,138,021 B2 | 3/2012 | Corisis et al. | |
| 8,736,068 B2 | 5/2014 | Bartley et al. | |
| 8,805,132 B2 | 8/2014 | Barowski et al. | |
| 9,515,017 B2 * | 12/2016 | Qian | H01L 23/49827 |
| 2002/0081816 A1 | 6/2002 | Spooner et al. | |
| 2002/0096743 A1 | 7/2002 | Spooner et al. | |
| 2003/0001282 A1 | 1/2003 | Meynen et al. | |
| 2005/0104172 A1 * | 5/2005 | Awujoola | H01L 23/3128 |
| | | | 257/678 |
| 2010/0279466 A1 | 11/2010 | Corisis et al. | |
| 2011/0115075 A1 | 5/2011 | Hu et al. | |
| 2013/0214432 A1 | 8/2013 | Wu et al. | |
| 2014/0374921 A1 | 12/2014 | Yu et al. | |
| 2015/0048523 A1 | 2/2015 | Suga et al. | |
| 2015/0091178 A1 | 4/2015 | Reber et al. | |
| 2016/0181189 A1 * | 6/2016 | Qian | H01L 23/49827 |
| | | | 174/264 |

OTHER PUBLICATIONS

International Search Report and Written Opinion dated Feb. 29, 2016 for International Patent Application No. PCT/US2015/063822, 11 pages.

Non-Final Office Action dated Feb. 17, 2016 for U.S. Appl. No. 14/943,880, 7 pages.

Non-Final Office Action dated Apr. 28, 2016 for U.S. Appl. No. 14/943,880, 20 pages.

Notice of Allowance dated Aug. 12, 2016 for U.S. Appl. No. 14/943,880, 5 pages.

Chipworks, Inc., "US20160181189A1 Freescale B442ONSE7QQMD Information Document," Oct. 27, 2016, 13 pages.

* cited by examiner

GROUND VIA CLUSTERING FOR CROSSTALK MITIGATION

CROSS REFERENCE TO RELATED APPLICATION

This application is a continuation of U.S. patent application Ser. No. 14/943,880 filed on Nov. 17, 2015, which is a continuation of U.S. patent application Ser. No. 14/575,956, filed Dec. 18, 2014, and issued on Jan. 5, 2016, as U.S. Pat. No. 9,230,900, both of which are entitled "GROUND VIA CLUSTERING FOR CROSSTALK MITIGATION," and which are herein incorporated by reference in their entirety.

FIELD

Embodiments of the present disclosure generally relate to the field of integrated circuits, and more particularly, to techniques and configurations for ground via clustering for crosstalk mitigation in integrated circuit assemblies.

BACKGROUND

High-speed signal-ended buses are widely used for both on-package and off-package lines of communication to address high bandwidth demands of integrated circuit (IC) packages. However, crosstalk, especially that of the vertical interconnects, may limit the data rate that these high-speed signal-ended buses are able to achieve and, therefore, may pose a challenge in meeting signaling performance targets. Additional pins may be utilized for ground connections so that more vertical interconnects are available to be assigned as grounds in an effort to isolate signals from each other and hence lower crosstalk between signals. However, these additional pins may increase the package form factor and may increase the cost of manufacturing.

The background description provided herein is for generally presenting the context of the disclosure. Unless otherwise indicated herein, the materials described in this section are not prior art to the claims in this application and are not admitted to be prior art or suggestions of the prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
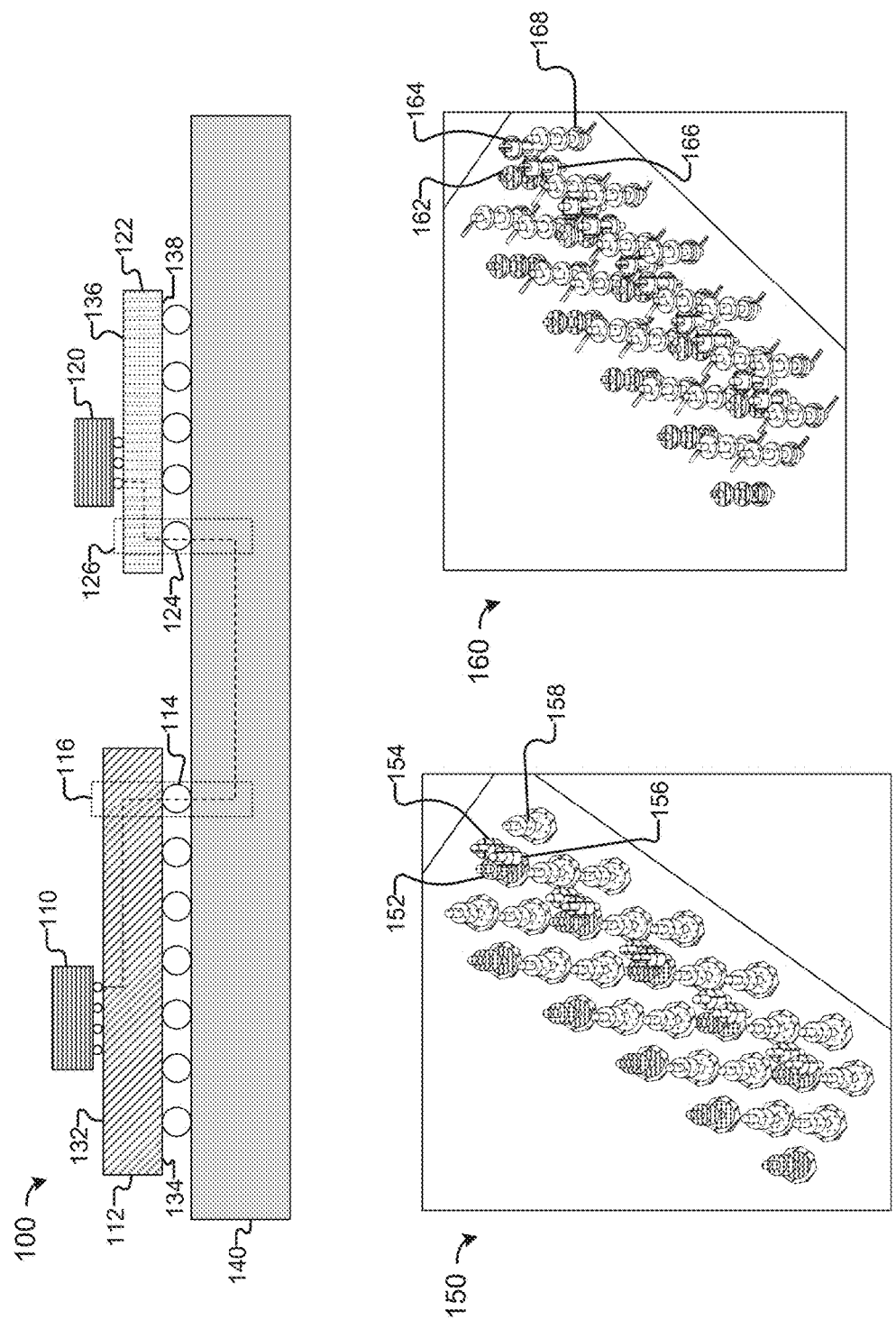
FIG. 1 schematically illustrates a cross-section side view of an example integrated circuit (IC) assembly with ground via clustering, and two three-dimensional (3D) models of interconnects with ground via clustering in one package substrate of the example IC assembly, in accordance with some embodiments.

Embodiments of the present disclosure describe techniques and configurations associated with ground via clustering for crosstalk mitigation in integrated circuit (IC) assemblies. For example, techniques described herein may be used to fabricate a package substrate having vertical interconnects with clusters of ground vias. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "in embodiments," or "in some embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality. The term "processor" may refer to any device or portion of a device that processes electronic data from registers and/or memory to transform that electronic data into other electronic data that may be stored in registers and/or memory.

FIG. 1 schematically illustrates a cross-section side view of an example IC assembly 100 including package substrates 112 and 122 having vertical interconnects with clusters of ground vias, in accordance with some embodiments.

As used herein, first level interconnect (FLI) may refer to an interconnect between a die (e.g., die 110 or 120) and a package substrate (e.g., package substrate 112 or 122), while second level interconnect (SLI) may refer to the interconnect between the package substrate (e.g., package substrate 112 or 122) and another package substrate (e.g., interposer 140) or circuit board. In embodiments, IC assembly 100 may include one or more dies (e.g., dies 110 and 120). Dies 110 and 120 may be electrically and/or physically coupled with package substrates 112 and 122, respectively, via one or more FLI structures. Package substrates 112 and 122 may further be electrically coupled with interposer 140 via one or more SLI structures.

Either or both of dies 110 and 120 may represent a discrete unit made from a semiconductor material using semiconductor fabrication techniques such as thin film deposition, lithography, etching, and the like. In some embodiments, either or both of dies 110 and 120 may include or be a part of a processor, memory, switch, ASIC, or SoC. Dies 110 and 120 may be electrically and/or physically coupled with package substrates 112 and 122, respectively, according to a variety of suitable configurations, including a flip-chip configuration, as depicted, or other configurations such as, for example, being embedded in the package substrate.

In the flip-chip configuration, die 110 may be coupled with surface 132 of package substrate 112 using FLI structures such as the interconnect structures depicted. These interconnect structures may be configured to electrically and/or physically couple die 110 with the package substrate 112. In various embodiments, these interconnect structures may be electrically coupled with electrical routing features of interposer 140 configured to route electrical signals between die 110 and die 120, or between die 110 and any other electrical components. Similarly, die 120 may be coupled with a surface 136 of package substrate 122 using FLI structures such as the interconnect structures depicted. These interconnect structures may be configured to electrically and/or physically couple die 120 with the package substrate 122. In embodiments, these interconnect structures may be electrically coupled with electrical routing features of interposer 140 configured to route electrical signals between die 120 and die 110, or between die 120 and any other electrical components. In some embodiments, the electrical signals may include input/output (I/O) signals and/or power/ground associated with operation of the dies 110 and/or 120.

In some embodiments, various components in FIG. 1 may form a package-level high-speed single-ended channel. In such embodiments, package substrate 112 may be a stacked via laminate core (SVLC) package substrate, and package substrate 122 may be a standard core package substrate. In some embodiments, die 110 may be a processor, and die 120 may be another processor, a memory device, or a field-programmable gate array (FPGA) device such as a network switch. As depicted, die 110 may be coupled with the SVLC package substrate while die 120 may be coupled with the standard core package substrate. Both the SVLC package substrate and the standard core package substrate may then be coupled with another package substrate (e.g., interposer 140), via, for example, ball grid array (BGA) interconnect structures (e.g., solder balls 114 or 124) to complete the high-speed single-ended channel.

It will be appreciated that the BGA interconnect structures depicted by solder balls 114 or 124 are merely meant to be example interconnect structures for the sake of discussion. In other embodiments, land-grid array (LGA) structures may electrically couple one or more lands on package substrate 112 with one or more pads on interposer 140, which may route electrical signals between package substrate 112 and interposer 140. It will be appreciated that the above discussed examples are meant to be illustrative and that any of a variety of suitable interconnect structures and/or layers may be utilized to electrically couple dies 110 and 120 or other dies (not shown) with the interposer 140. It will be appreciated that various embodiments may additionally include other interconnect structures, such as, for example, trenches, vias, traces, or conductive layers, and the like that may be utilized to implement a high-speed single-ended channel to route electrical signals between die 110 and die 120.

The vertical interconnects in package substrate 112 may be schematically illustrated by the 3D model 150. In one embodiment, the vertical interconnect 116 may correspond to three vertical interconnect sub-components 152, 154, and 156. In various embodiments, the three vertical interconnect sub-components 152, 154, and 156 may be used to route a ground between package substrate 112 and interposer 140, e.g., through surface 134. Further, in some embodiments, the three vertical interconnect sub-components 152, 154, and 156 may be surrounded by several vertical interconnects (e.g., interconnect 158) that may route input/output (I/O) signals between package substrate 112 and interposer 140. In some embodiments, the vertical interconnects depicted in 3D model 150 may form a 2:1 signal-to-ground ratio.

Similarly, the vertical interconnects in package substrate 122 may be schematically illustrated by the 3D model 160. In one embodiment, the vertical interconnect 126 may correspond to three vertical interconnect sub-components 162, 164, and 166. In various embodiments, the three vertical interconnect sub-components 162, 164, and 166 may be used to route a ground between package substrate 122 and interposer 140, e.g., through surface 138. Further, in some embodiments, the three vertical interconnect sub-components 162, 164, and 166 may be surrounded by several vertical interconnects (e.g., interconnect 168) that may route input/output (I/O) signals between package substrate 122 and interposer 140. In some embodiments, the vertical interconnects depicted in 3D model 160 may also form a 2:1 signal-to-ground ratio.

In various embodiments, the three vertical interconnect sub-components 152, 154, and 156 may form at least one ground via cluster. Similarly, the three vertical interconnect sub-components 162, 164, and 166 may also form at least one ground via cluster. 3D model 150 and 3D model 160 reflects the effect of ground via clustering. In some embodiments, the extra ground interconnect sub-components (e.g., 154 and 156) may be only applied to the outermost column of ground interconnects, or the column of ground interconnects that are closest to a signal source (e.g., vertical interconnects 116 and 126). Such an embodiment, may be beneficial because the first two columns of interconnects may demonstrate more crosstalk between the signals carried by these interconnects than those of inner columns. In other embodiments, the extra ground interconnect sub-components (e.g., 164 and 166) may also be applied to other inner ground columns.

Crosstalk of the single-ended signaling may be highly sensitive to the ground reference design in the vertical interconnects. For example, when the coupling between a first signal and an associated ground gets stronger, the mutual coupling between the first signal and a second signal may become weaker. As a result, the crosstalk may be mitigated between these two signals by increasing the strength of the coupling between these two signals and the respective grounds associated with these two signals. As such, adding more interconnect structures (e.g., BGA connections) and assigning them to ground may produce better signal-to-signal isolation. For example, changing to a conservative 1:1 signal-to-ground ratio from a 2:1 signal-to-ground ratio may help mitigate the signaling risk, but such a configuration would require additional 80 ground balls for a 2×40 interface, which would consequentially increase the cost and the size of the package form factor.

In various embodiments, the ground via clustering design, as shown in 3D model 150 and 3D model 160, would eliminate or reduce the increase in size of the package form factor discussed above. As such, clustering ground vias adjacent to each other, as shown in 3D model 150 and 3D model 160, may increase the size of ground and, as a result, may boost the coupling between a signal and an associated ground without increasing the corresponding footprint. Thus, the ground via clustering may be implemented with existing substrate design rules and without impacting the rest of the package design.

In various embodiments, ground via clustering may reduce both far-end and the near-end crosstalk. Thus, ground via clustering may be implemented in both terminated and un-terminated high-speed single-ended channels. In some instances, ground via clustering may reduce crosstalk by 50% or more. Moreover, the ground via clustering design may also improve signal-to-noise ratio (SNR) of the signal. Thus, channel signaling risk may be reduced without a corresponding increase in a size of the package form factor.

Figure 2:
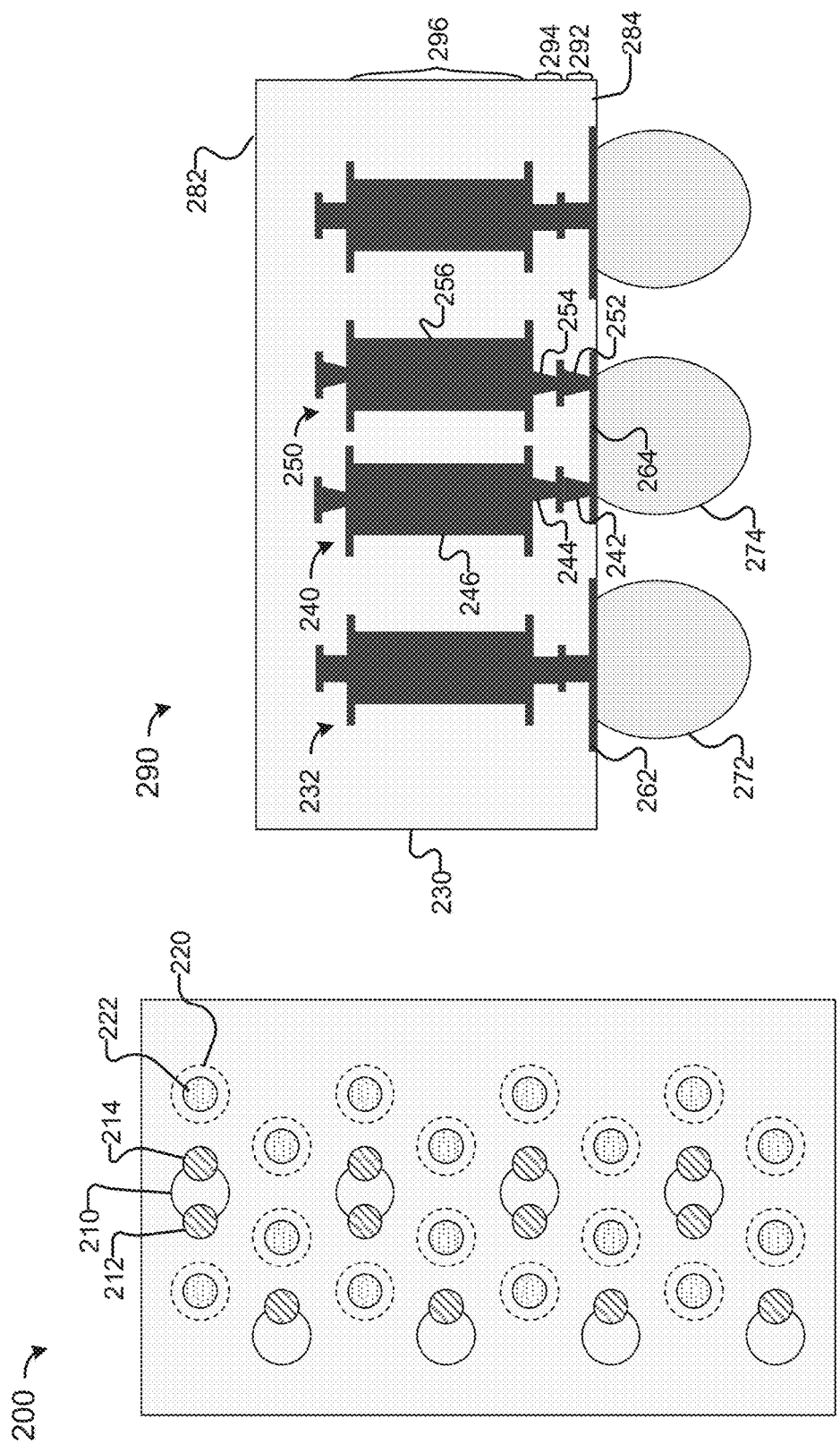
FIG. 2 schematically illustrates a top view and a cross-section side view of example two-via clustering patterns, in accordance with some embodiments.

FIG. 2 schematically illustrates a top view 200 and a cross-section side view 290 of example two-via clustering patterns, in accordance with some embodiments. Three-via clustering patterns or ground via clustering patterns with more than three ground vias may also be used in other embodiments. In various embodiments, a cluster of ground vias instead of a single ground via may be used to mitigate or reduce the crosstalk without the need for any additional interconnect structures between two package substrates.

In some embodiments, such as that depicted, the cluster of ground vias may be surrounded by signal vias, of a same layer (e.g., layer 296), in a hexagonal pattern. For example, one cluster of ground vias (e.g., ground vias 212 and 214) may be surrounded by six signal vias (e.g., signal via 222) having respective ball pad 220 in a hexagonal arrangement. In other embodiments, other patterns, e.g., four signal vias disposed in a square arrangement around a cluster of ground vias, may also be used without departing from the scope of this disclosure.

In some embodiments, the two ground vias may be formed substantially apart from each other, but may still contact the same underlying contact structure (e.g., ball pad). For example, as depicted, ground vias 212 and 214 are formed apart from each other, but still contact the same ball pad 210.

Cross-section side view 290 schematically illustrates an example two-via clustering pattern. Package substrate 230 may have one side (e.g., side 282) to receive a die and another side (e.g., side 284) to be coupled with another package substrate or circuit board. In various embodiments, vertical interconnect structures (e.g., vertical interconnect structures 232, 240, and 250) may be disposed in package substrate 230. Vertical interconnect structures may electrically couple structures such as, for example, traces, trenches, vias, lands, pads or other structures that may establish corresponding electrical pathways for electrical signals through package substrate 230.

In some embodiments, e.g., for implementation in server products, vertical interconnect structures may be longer than 1 millimeter (mm), including stacks of micro-vias and core vias, and a solder ball. A core via may be an opening through the core substrate filled with conducting material that may be used to connect routing features, e.g., a metal pad, placed on one face of the substrate core with routing features, e.g., another metal pad, placed on the opposite face of the substrate core. In various embodiments, a core via may be much bigger than a micro-via as the core layer may be much thicker than build-up layers in an organic package. In such embodiments, vertical interconnect structure 232 may include stacks of vias disposed on ball pad 262, which in turn may have solder ball 272 disposed thereon. Vertical interconnect structure 232 may be used to route signals through package substrate 230.

As depicted, in some embodiments, vertical interconnect structure 240 may include stacks of vias (e.g., via 242, via 244, and via 246) disposed on ball pad 264, which in turn may have solder ball 274 disposed thereon. Vertical interconnect structure 240 may be used to route a ground through package substrate 230. Similarly, vertical interconnect structure 250 may include stacks of vias (e.g., via 252, via 254, and via 256) disposed on a same ball pad 264, which in turn may have solder ball 274 disposed thereon. Vertical interconnect structure 250 may also be used to route a ground through package substrate 230.

In some embodiments, package substrate 230 may be an epoxy-based laminate substrate having build-up layers such as, for example, an Ajinomoto Build-up Film (ABF) substrate. In various embodiments, package substrate 230 may include other suitable types of substrates including, for example, substrates formed from glass, ceramic, or semiconductor materials. In various embodiments, via 242 and via 252 may be formed in the same substrate layer 292, while via 244 and via 254 may be formed in the same substrate layer 294. Similarly, via 246 and via 256 may be formed in the same substrate layer 296. In some embodiments, via 246 and via 256 may be core vias in a core layer. Thus, Via 242 and via 252 may form a ground via cluster in layer 292, while via 244 and via 254 may form another ground via cluster in layer 294. Similarly, via 246 and via 256 may form yet another ground via cluster in layer 296.

In various embodiments, via 242 and via 252 may be formed in layer 292 in any conventional manner known in the art. For example, an opening may be formed over pad 264 by drilling in a region of dielectric material disposed over pad 264, using a technique, such as employing $CO_2$ or a UV laser. In embodiments, any conventional plating operations may be used to deposit electrically conductive material into the openings to form vias. In some embodiments, electrolytic plating operations may be used to deposit the electrically conductive material into the drilled openings, and chemical, mechanical polishing (CMP) or copper (Cu) etching operations may be used after depositing the electrically conductive material to remove any excess electrically conductive material. In various embodiments, via 246 and via 256 may be formed in layer 296 with similar or different manners known in the art.

In various embodiments, layer 292, layer 294, or layer 296 may be a dielectric layer composed of any of a wide variety of suitable dielectric materials including, for example, epoxy-based laminate material, silicon oxide ($SiO_2$), silicon carbide (SiC), silicon carbonitride (SiCN), or a silicon nitride (e.g., SiN, $Si_3N_4$, etc.). In embodiments, layer 292 or layer 294 may include a polymer (e.g., epoxy-based resin) and may further include a filler (e.g., silica) to provide suitable mechanical properties to meet reliability standards of the resulting package. In embodiments, layer 292, layer 294, or layer 296 may be formed as a film of polymer, such as by ABF lamination. In embodiments, layer 292, layer 294, or layer 296 may be formed by depositing a dielectric material using any suitable technique including, for example, atomic layer deposition (ALD), physical vapor deposition (PVD) or chemical vapor deposition (CVD) techniques.

In embodiments, substrate 230 may include multiple routing features, such as pad 262 or pad 264, configured to advance the electrical pathways within or through the substrate. In various embodiments, pad 262 or pad 264 may be composed of any suitable electrically conductive material such as metal including, for example, nickel (Ni), palladium (Pd), gold (Au), silver (Ag), copper (Cu), or any combinations thereof. In some embodiments, pad 262 or pad 264 may be formed using a patterned metal layer configured to: electrically couple pad 262 with vertical interconnect structure 232 to route electrical signals through the package substrate 230; or electrically couple pad 264 with vertical interconnect structures 240 and 250 to route a ground through the package substrate 230. The patterned metal layer may be formed in any conventional manner known in the art. For example, the patterned metal layer may be an inner or outermost conductive layer of a build-up layer formed with a semi-additive process (SAP).

Figure 3:
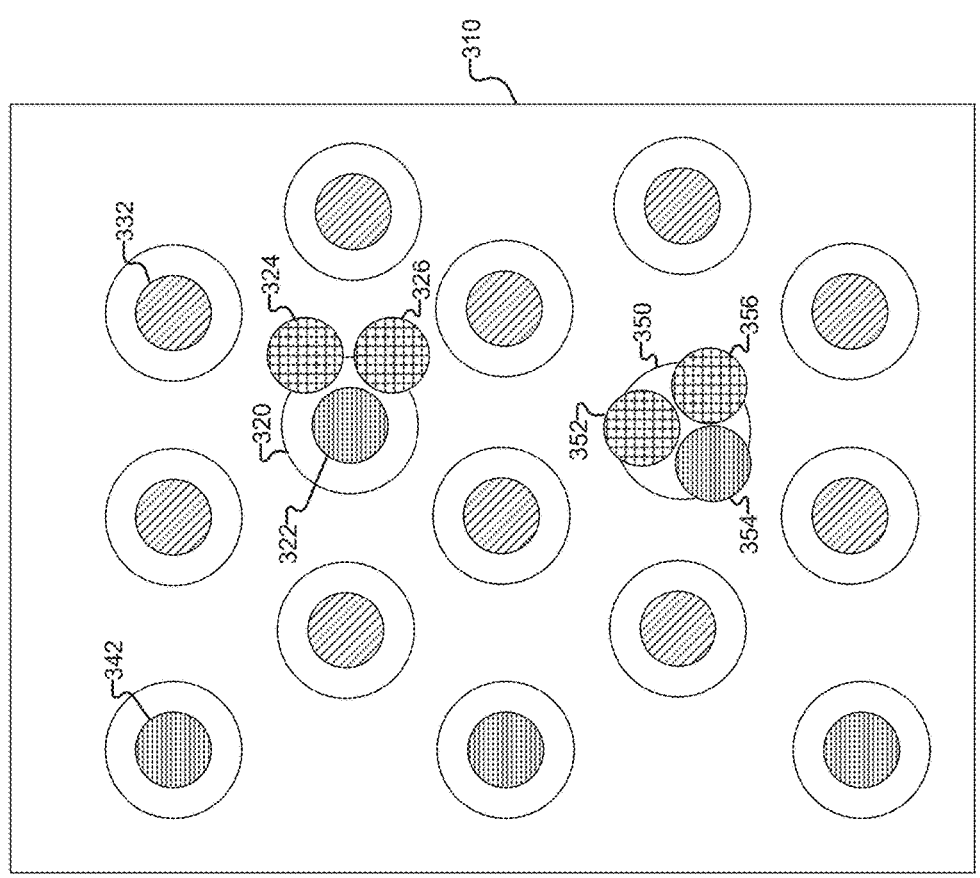
FIG. 3 schematically illustrates a top view of example three-via clustering patterns, in accordance with some embodiments.

FIG. 3 schematically illustrates a top view of example three-via clustering patterns, in accordance with some embodiments. In some embodiments, examples of using three-via clustering may be used in a hexagonal arrangement. For example, a cluster of ground vias may be surrounded by signal vias, of the same layer of vias, disposed in a hexagonal pattern, i.e., one cluster of ground vias surrounded by six signal vias. As illustrated in FIG. 3, the cluster of ground vias 322, 324, and 326 are surrounded by signal vias including signal via 332 in a hexagonal arrangement. Similarly, the cluster of ground vias 352, 354, and 356 may also be surrounded by signal vias in a similar hexagonal arrangement. In other embodiments, other patterns, e.g., four signal vias disposed in a square arrangement around a cluster of ground vias, may also be used to arrange signals vias surrounding the cluster of ground vias without departing from the scope of the present disclosure.

As discussed in reference to FIG. 1, above, ground via clustering may be used for the SVLC package substrates and standard core package substrates. The SVLC package substrates and the standard core package substrates may have to comport with various different design rules and different ball pitches. However, as depicted, two ground vias may be successfully added to form the three-via cluster without violating these existing design rules. For example, vertical interconnect structure stacks of micro-vias and core-vias may be formed adjacent to original ground vias in an existing design, and, as a result, may maintain the form factor of the design.

In some embodiments, the cluster of ground vias may be in a triangular arrangement. As an example, ground vias 322, 324, and 326 are depicted in a triangular arrangement. Similarly, ground vias 352, 354, and 356 are depicted in another triangular arrangement. In some embodiments, one ground via may be disposed over the center of the underlying contact (e.g., a ball pad), and the other two ground vias may be added to a side of the underlying contact. For example, among the cluster of ground vias 322, 324, and 326, via 322 is placed at the center of ball pad 320, in a similar manner to ground via 342 and its associated ball pad. However, ground vias 324 and 326 may be added to ground via 322 to form the ground via cluster in a triangular arrangement. In some embodiments, the center of the triangular arrangement of ground vias may be disposed over the center of the underlying contact. For example, ground vias 352, 354, and 356 form a triangular arrangement, and the center of the cluster overlaps with the center of ball pad 350.

In various embodiments, two or more ground vias may be arranged in various cluster designs. For example, the number of ground vias to be clustered may be more than three depending on the design space or other design constraints. In some embodiments, the ground via cluster may be placed closer to certain signals as an emphasis. As an example, the arrangement of ground vias 322, 324, and 326 has more emphasis on signals near edge 310 because those signals generally demonstrate greater inclination for crosstalk. In some embodiments, the ground via cluster may be centered, as shown in the arrangement of ground vias 352, 354, and 356, which may provide an equal improvement on all the surrounding signals. In various embodiments, ground via clustering, as shown in FIG. 3, may reduce far-end crosstalk (FEXT) and near-end crosstalk (NEXT). Consequently, the signal-to-noise ratio (SNR) may be improved for the channel.

Figure 4:
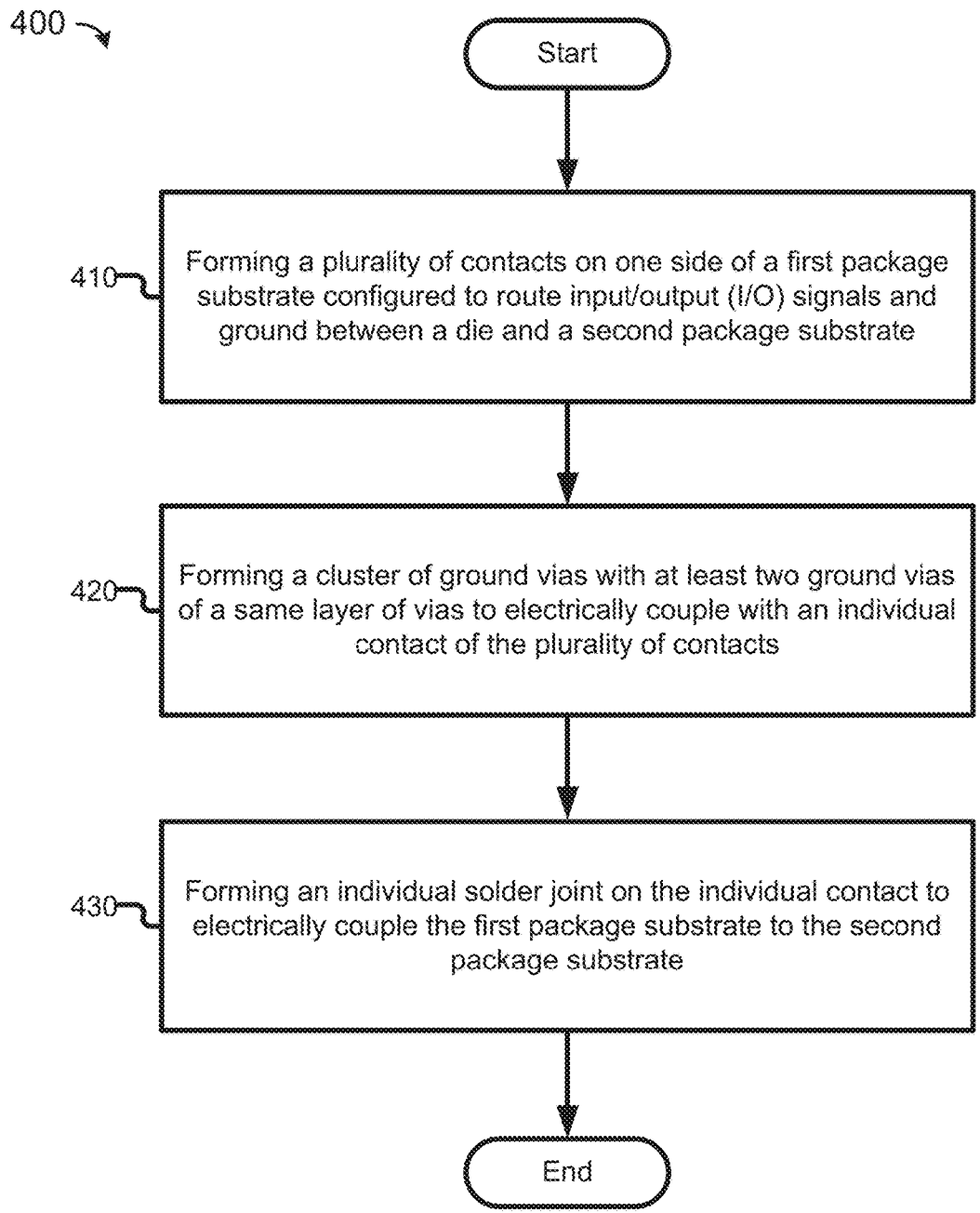
FIG. 4 schematically illustrates a flow diagram of an example process of forming ground via clustering for crosstalk mitigation in IC assemblies, in accordance with some embodiments.

FIG. 4 schematically illustrates a flow diagram of an example process 400 of forming a ground via cluster for crosstalk mitigation in IC assemblies (e.g., IC assembly 100 of FIG. 1), in accordance with some embodiments. The process 400 may comport with embodiments described in connection with previous figures according to various embodiments.

At block 410, the process 400 may include forming a plurality of electrical contacts on one side of a first package substrate configured to route input/output (I/O) signals and ground between a die and a second package substrate. In various embodiments, the contacts on the side of the first package substrate may include ball pads. In some embodiments, ball pads may be solder mask defined (SMD). In other embodiments, ball pads may be non-solder mask defined (NSMD). In some embodiments, forming contacts on one side of the package substrate may be realized by embedding the contacts (e.g., pads) in build-up layers (e.g., the outermost build-up layer) as part of the formation of the build-up layers. In some embodiments, forming contacts on one side of the package substrate may be realized by forming openings in the build-up layers and disposing the contacts (e.g., pads) into the cavities subsequent to formation of the build-up layers, according to any suitable technique.

At block 420, the process 400 may include forming a cluster of ground vias with at least two ground vias, of a same layer of vias, to electrically couple with an individual contact of the plurality of contacts. Block 420 may be performed during the fabrication process of a package substrate according to various embodiments, e.g., during the fabrication of various layers of package substrate 230, such as layer 292 or layer 294. In various embodiments, forming the cluster of ground vias may include forming the cluster of ground vias in a column of ground vias closest to an edge of the package substrate, such as the first column of ground vias. The first two columns of signals may demonstrate a higher susceptibility to crosstalk than the inner columns; thus, forming the cluster of ground vias in a column of ground vias closest to an edge of the package substrate may mitigate such crosstalk. In some embodiments, block 420 may be performed only to the column of ground vias closest to the edge, which may yield a cost-effective solution in reducing such crosstalk.

In various embodiments, forming the cluster of ground vias may include forming a vertical interconnect structures including the cluster of ground vias between two sides of the first package substrate, e.g., the vertical interconnect structures 240 and 250 in FIG. 2 formed between side 282 and side 284 of package substrate 230. In some embodiments, forming the cluster of ground vias may include forming the cluster of ground vias in an outermost layer of vias adjacent to the side, e.g., via 242 and via 252 in FIG. 2 as a part of the outermost layer of vias in layer 292. In some embodiments, forming the cluster of ground vias may include forming the cluster of ground vias in a second layer of vias directly adjacent to the outermost layer of vias, e.g., as via 244 and via 254 in layer 294 in FIG. 2. In some embodiments, forming the cluster of ground vias may include forming the cluster of core vias in a same layer of vias, e.g., as via 246 and via 256 in layer 296 in FIG. 2.

In some embodiments, forming the cluster of ground vias may include forming two ground vias apart from each other. As illustrated in FIG. 2, the cluster of ground vias 212 and 214 may be formed apart from each other, but still in contact with the same ball pad 210. In some embodiments, forming the cluster of ground vias may include forming three ground vias in a triangular arrangement. In such embodiments, the center of the triangular arrangement of ground vias may be disposed over a center of the ball pad. As illustrated in FIG. 3, ground vias 352, 354, and 356 may form a triangular arrangement, and the center of the cluster may overlap with the center of ball pad 350. In various embodiments, forming the cluster of ground vias may include forming the cluster of ground vias surrounded by signal vias of the same layer of vias. As illustrated in FIG. 3, the cluster of ground vias 322, 324, and 326 may be surrounded by signal vias including signal via 332 in a hexagonal arrangement.

At block 430, the process 400 may include forming an individual solder joint on an individual contact to electrically couple the first package substrate to the second package substrate or circuit board. In various embodiments, the individual contact on the first package substrate may be a ball pad, which may correspond to a counterpart contact on the second package substrate, such as a solder pad. A solder ball may then be used to couple the ball pad with the solder pad, e.g., in a BGA configuration, to form a corresponding solder joint that may be configured to further route the electrical signals between the first and second package substrates. In other embodiments, individual solder joint may be formed as other types of package interconnects, such as land-grid array (LGA) structures or other suitable structures.

Various operations are described as multiple discrete operations in turn, in a manner that is most helpful in understanding the claimed subject matter. However, the order of description should not be construed as to imply that these operations are necessarily order dependent. Operations of the process 400 may be performed in another suitable order than depicted.

Figure 5:
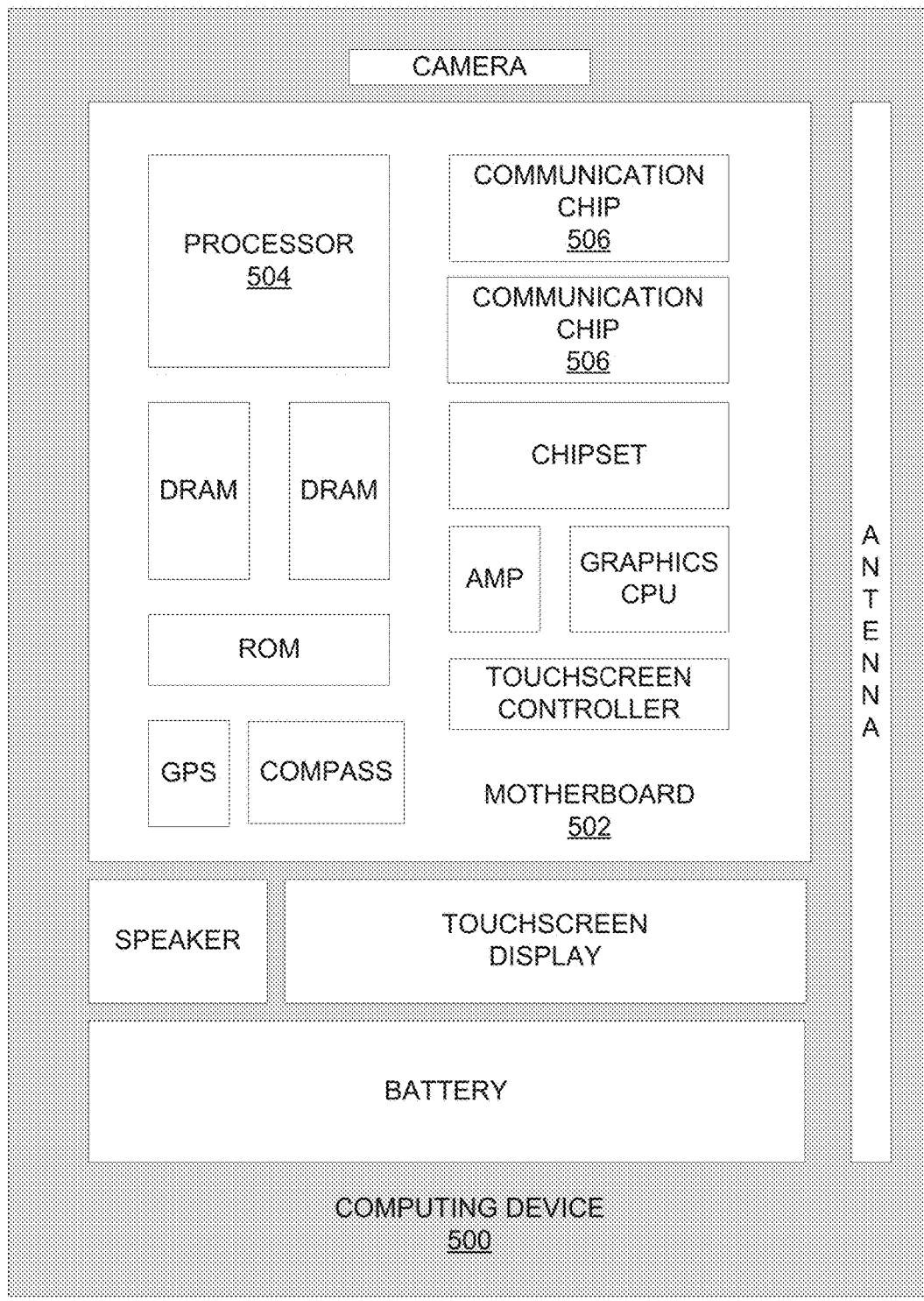
FIG. 5 schematically illustrates a computing device including ground via clustering for crosstalk mitigation described herein, in accordance with some embodiments.

Embodiments of the present disclosure may be implemented into a system using any suitable hardware and/or software to configure as desired. FIG. 5 schematically illustrates a computing device that includes ground via clustering for crosstalk mitigation in integrated circuit assemblies, as described herein, in accordance with some embodiments. The computing device 500 may house a board such as motherboard 502. Motherboard 502 may include a number of components, including but not limited to processor 504 and at least one communication chip 506. Processor 504 may be physically and electrically coupled to motherboard 502. In some implementations, the at least one communication chip 506 may also be physically and electrically coupled to motherboard 502. In further implementations, communication chip 506 may be part of processor 504.

Depending on its applications, computing device 500 may include other components that may or may not be physically and electrically coupled to motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

Communication chip 506 may enable wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. Communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. Communication chip 506 may operate in accordance with other wireless protocols in other embodiments.

Computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, EV-DO, and others.

Processor 504 of computing device 500 may be packaged in an IC assembly (e.g., IC assembly 100 of FIG. 1) that includes a substrate (e.g., package substrate 112 of FIG. 1) with vertical interconnect structures having ground via clusters formed according to techniques as described herein. For example, processor 504 may be die 110 coupled to package substrate 112 using interconnect structures. The term "processor" may refer to any device or portion of a device that processes electronic data from registers and/or memory to transform that electronic data into other electronic data that may be stored in registers and/or memory.

Communication chip 506 may also include one or more dies that may be packaged in an IC assembly (e.g., IC assembly 100 of FIG. 1) that includes a substrate (e.g., package substrate 112 of FIG. 1) with vertical interconnect structures having ground via clusters formed according to techniques as described herein.

In further implementations, another component (e.g., memory device or other integrated circuit device) housed within computing device 500 may include one or more dies that may be packaged in an IC assembly (e.g., IC assembly 100 of FIG. 1) that includes a substrate (e.g., package substrate 122 of FIG. 1) with vertical interconnect structures having ground via clusters formed according to techniques as described herein.

According to some embodiments, multiple processor chips and/or memory chips may be disposed in an IC assembly including a package substrate with ground via clusters in vertical interconnect structures, which may be a part of the channel to electrically route signals between any two of the processor or memory chips.

In various implementations, computing device 500 may be a laptop, a netbook, a notebook, an Ultrabook™, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

EXAMPLES

According to various embodiments, the present disclosure describes an integrated circuit (IC) package assembly. Example 1 of an IC package assembly may include a first package substrate configured to route input/output (I/O) signals and ground between a die and a second package substrate, the first package substrate having a first side configured to receive the die and a second side opposite the first side. The first package substrate may include a plurality of contacts disposed on the second side of the first package substrate; and at least two ground vias of a same layer of vias, wherein an individual contact of the plurality of contacts is configured to form an individual solder joint with the second package substrate, and wherein the at least two ground vias form a cluster of ground vias electrically coupled with the individual contact. Example 2 may include the subject matter of Example 1, wherein the cluster of ground vias is part of a vertical interconnect between the first side and the second side of the first package substrate. Example 3 may include the subject matter of Example 1 or 2, wherein the same layer of vias is an outermost first layer of vias adjacent to the second side, a second layer of vias directly adjacent to the outermost first layer of vias, or a third layer of vias directly adjacent to the second layer of vias. Example 4 may include any subject matter of Examples 1-3, wherein the cluster of ground vias is a part of a column of ground vias closest to an edge of the first package substrate. Example 5 may include any subject matter of Examples 1-4, wherein the cluster of ground vias is surrounded by signal vias of the same layer of vias. Example 6 may include the subject matter of Example 5, wherein the signal vias are configured in a substantially hexagonal arrangement around the cluster of ground vias. Example 7 may include any subject matter of Examples 1-6, wherein the cluster of ground vias includes three ground vias in a triangular arrangement. Example 8 may include the subject matter of Example 7, wherein a center of the triangular arrangement is disposed over a center of the individual contact. Example 9 may include any subject matter of Examples 1-8, further include the second package substrate, wherein the second package substrate is coupled with the first package substrate through the individual solder joint. Example 10 may include any subject matter of Examples 1-9, wherein a distance between the at least two ground vias is less than a diameter of the individual contact. Example 11 may include any subject matter of Examples 1-10, wherein the at least two ground vias have a same diameter. Example 12 may include any subject matter of Examples 1-11, wherein the individual solder joint is part of a ball grid array (BGA) configuration of solder joints. Example 13 may include any subject matter of Examples 1-12, wherein the first package substrate is a stacked via laminate core package or a core BGA package.

According to various embodiments, the present disclosure describes a method. Example 14 of a method may include forming a plurality of contacts on a side of a first package substrate configured to route input/output (I/O) signals and ground between a die and a second package substrate; forming a cluster of ground vias with at least two ground vias of a same layer of vias to electrically couple with an individual contact of the plurality of contacts; and forming an individual solder joint on the individual contact to electrically couple the first package substrate to the second package substrate. Example 15 may include the method of Example 14, wherein forming the cluster of ground vias comprises forming a vertical interconnect including the cluster of ground vias between two sides of the first package substrate. Example 16 may include the method of claim 14 or 15, wherein forming the cluster of ground vias comprises forming the cluster of core vias in the same layer of vias. Example 17 may include any method of claims 14-16, wherein forming the cluster of ground vias comprises forming the cluster of ground vias surrounded by signal vias of the same layer of vias. Example 18 may include any method of claims 14-17, wherein forming the cluster of ground vias comprises forming three ground vias in a triangular arrangement. Example 19 may include the method of claim 18, wherein a center of the triangular arrangement is disposed over a center of the individual contact. Example 20 may include any method of claims 14-19, wherein forming the cluster of ground vias comprises forming two ground vias apart from each other. Example 21 may include any method of claims 14-20, wherein forming the cluster of ground vias comprises forming the cluster of ground vias in a column of ground vias closest to an edge of the first package substrate.

According to various embodiments, the present disclosure may describe a package assembly. Example 22 of an package assembly may include a first die; a first package substrate, electrically coupled to the first die and configured to route input/output (I/O) signals and ground between the first die and a second package substrate, the first package substrate having a first side configured to receive the die and a second side opposite the first side, the first package substrate including a plurality of contacts disposed on the second side of the first package substrate; and at least two ground vias of a same layer of vias, wherein an individual contact of the plurality of contacts is configured to form an individual solder joint with the second package substrate, and wherein the at least two ground vias form a cluster of ground vias electrically coupled with the individual contact; the second package substrate with an interconnect embedded in the second package substrate to electrically couple the first package substrate with a third package substrate; and the third package substrate, electrically coupled to the second package substrate and a second die, configured to route input/output (I/O) signals and ground between the second die and the second package substrate. Example 23 may include the package assembly of claim 21, wherein the first package substrate is a stacked via laminate core package, wherein the second package substrate is an interposer, and wherein the third package substrate is a core ball grid array package. Example 24 may include the package assembly of claim 22 or 23, wherein the first die is a CPU, and wherein the second die is a switch. Example 25 may include any package assembly of claims 22-24, wherein the cluster of ground vias is a part of a column of ground vias closest to an edge of the first package substrate.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A package substrate that comprises:
    a first side to receive a die;
    a second side opposite the first side, the second side with a plurality of contacts disposed thereon;
    a vertical interconnect between the first side and the second side, wherein the vertical interconnect includes a cluster of ground vias that are electrically coupled with an individual contact of the plurality of contacts; and
    signal vias of a same layer of vias as the ground vias, wherein the signal vias surround the cluster of ground vias.

2. A package substrate comprising:
    a plurality of contacts disposed on a first side of the package substrate; and
    two ground vias of a same layer of vias, wherein the two ground vias form a cluster of ground vias electrically coupled with an individual contact of the plurality of contacts.

3. The package substrate of claim 2, wherein the cluster of ground vias is part of a vertical interconnect between the first side of the package substrate and a second side of the package substrate opposite the first side.

4. The package substrate of claim 2, wherein the same layer of vias is an outermost first layer of vias adjacent to a second side of the package substrate opposite the first side of the package substrate, a second layer of vias directly adjacent to the outermost first layer of vias, or a third layer of vias directly adjacent to the second layer of vias.

5. The package substrate of claim 2, wherein the cluster of ground vias is a part of a column of ground vias closest to an edge of the package substrate.

6. The package substrate of claim 2, wherein the cluster of ground vias is surrounded by signal vias of the same layer of vias.

7. The package substrate of claim 6, wherein the signal vias are configured in a substantially hexagonal arrangement around the cluster of ground vias.

8. The package substrate of claim 2, wherein the cluster of ground vias includes three ground vias in a triangular arrangement.

9. The package substrate of claim 8, wherein a center of the triangular arrangement is disposed over a center of the individual contact.

10. The package substrate of claim 2, wherein a distance between the two ground vias is less than a diameter of the individual contact.

11. The package substrate of claim 2, wherein the two ground vias have a same diameter.

12. The package substrate of claim 2, wherein the package substrate is a stacked via a laminate core package or a core ball grid array (BGA) package.

13. A method of fabricating an integrated circuit (IC) package assembly comprising:
    forming a plurality of contacts on a package substrate; and
    forming a cluster of ground vias with at least two ground vias of a same layer of vias to electrically couple with an individual contact of the plurality of contacts.

14. The method of claim 13, wherein forming the cluster of ground vias comprises forming a vertical interconnect including the cluster of ground vias between two sides of the package substrate.

15. The method of claim 13, wherein forming the cluster of ground vias comprises forming a cluster of core vias in the same layer of vias.

16. The method of claim 13, wherein forming the cluster of ground vias comprises forming the cluster of ground vias surrounded by signal vias of the same layer of vias.

17. The method of claim 13, wherein forming the cluster of ground vias comprises forming three ground vias in a triangular arrangement.

18. The method of claim 17, wherein a center of the triangular arrangement is disposed over a center of the individual contact.

19. The method of claim 13, wherein forming the cluster of ground vias comprises forming two ground vias apart from each other.

20. The method of claim 13, wherein forming the cluster of ground vias comprises forming the cluster of ground vias in a column of ground vias closest to an edge of the package substrate.

* * * * *